US012677652B2

(12) United States Patent
Zhu et al.

(10) Patent No.: US 12,677,652 B2
(45) Date of Patent: Jul. 7, 2026

(54) BOTTOM LAYER METAL INTERCONNECTION LINE STRUCTURE

(71) Applicant: Shanghai Huali Integrated Circuit Corporation, Shanghai (CN)

(72) Inventors: Yekai Zhu, Shanghai (CN); Xin Sheng, Shanghai (CN); Wei Cao, Shanghai (CN); Yueqin Zhu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 443 days.

(21) Appl. No.: 18/238,646

(22) Filed: Aug. 28, 2023

(65) Prior Publication Data

US 2024/0282701 A1      Aug. 22, 2024

(30) Foreign Application Priority Data

Feb. 21, 2023     (CN) .......................... 202310146658.2

(51) Int. Cl.
H01L 23/528 (2006.01)
H10W 20/43 (2026.01)

(52) U.S. Cl.
CPC .................................... H10W 20/43 (2026.01)

(58) Field of Classification Search
CPC ............... H01L 23/5226; H01L 23/528; H01L 23/5283; H01L 23/34; H01L 22/32; G01R 31/2628; G01R 31/2619; G01R 31/2875; H10P 74/27; H10P 74/207; H10P 74/273; H10P 74/277; H10W 20/43
See application file for complete search history.

(56) References Cited

U.S. PATENT DOCUMENTS

2020/0388570 A1* 12/2020 Johnson .................... H10D 1/20
2024/0387362 A1* 11/2024 Lai ............................ H10D 1/20

* cited by examiner

*Primary Examiner* — John A Bodnar
(74) *Attorney, Agent, or Firm* — Banner & Witcoff, Ltd.

(57) ABSTRACT

The present application provides a bottom layer metal interconnection line structure, at least including a test key and leads connected to the test key; the test key being composed of a plurality of metal lines connected end-to-end; the plurality of metal lines being arranged in the same plane in a winding manner, wherein at least one suspending via structure is provided at each winding point; and two leads are provided and respectively connected to ends of the metal lines located at a head end and a tail end in the test key. The present application increases a maximum root-mean-square current that the winding metal interconnection lines can withstand while improving a heat dissipation problem of the bottom layer metal interconnection lines.

6 Claims, 1 Drawing Sheet

BOTTOM LAYER METAL INTERCONNECTION LINE STRUCTURE

CROSS-REFERENCE TO RELATED APPLICATIONS

This application claims priority to Chinese patent application No. 202310146658.2, filed on Feb. 21, 2023, the disclosure of which is incorporated herein by reference in its entirety.

TECHNICAL FIELD

The present application relates to the technical field of semiconductors, in particular to a bottom layer metal interconnection line structure.

BACKGROUND

The widespread application of copper interconnection technology in the field of integrated circuits effectively solves reliability problems such as time delay and electromigration caused by the miniaturization of an interconnection line dimension. However, with the iteration of process technologies, the miniaturization of the interconnection line dimension occurs constantly, and a heating situation of bottom layer metal lines becomes increasingly significant, limiting a maximum root-mean-square current that the metal interconnection lines can withstand. Particularly, in the case of a winding layout of the bottom layer metal lines, the self-heating situation of the metal lines intensifies, a maximum root-mean-square current that the winding metal interconnection lines can withstand is reduced significantly, and the metal interconnection lines are very prone to burning-out.

Therefore, it is extremely necessary to design a bottom layer metal interconnection line structure that does not affect the functionality of an interconnection line path and is capable of quick heat dissipation.

BRIEF SUMMARY

In view of the defect in the prior art mentioned above, the purpose of the present application is providing a bottom layer metal interconnection line structure, so as to solve the problem in the prior art that self-heating of metal lines intensifies such that a maximum root-mean-square current that the winding metal interconnection lines can withstand is reduced significantly, making the metal interconnection lines be very prone to burning-out.

To achieve the above purpose and other related purposes, the present application provides a bottom layer metal interconnection line structure, at least including:

a test key and leads connected to the test key; the test key being composed of a plurality of metal lines connected end-to-end; the plurality of metal lines being arranged in the same plane in a winding manner, wherein at least one suspending via structure is provided at each winding point.

Two leads are provided and respectively connected to ends of the metal lines located at a head end and a tail end in the test key.

In some examples, the plurality of metal lines have a same length; and the plurality of metal lines have a same width.

In some examples, each of the leads and each of the metal lines are placed perpendicular to each other in the same plane.

In some examples, at least one downward suspending via structure is provided at each winding point.

In some examples, an interlayer dielectric fully fills between the downward suspending via structures.

In some examples, the test key and the leads are covered with an intermetallic dielectric.

In some examples, the other end of the downward suspending via structure is connected to a gate of a device, and a longitudinal depth of the downward suspending via structure does not exceed a half of a depth of the gate of the device.

In some examples, the intermetallic dielectric is covered with an upper layer metal, and a depth of the downward suspending via structure does not exceed a half of a depth of the upper layer metal.

As stated above, the bottom layer metal interconnection line structure of the present application has the following beneficial effects: the present application increases a maximum root-mean-square current that the winding metal interconnection lines can withstand while improving a heat dissipation problem of the bottom layer metal interconnection lines.

DETAILED DESCRIPTION OF THE DISCLOSURE

The implementations of the present application are described below via specific examples, and those skilled in the art could readily understand other advantages and effects of the present application from the contents disclosed in the description. The present application can also be implemented or applied using other different specific implementations, and various details in the description can also be modified or changed based on different viewpoints and applications without departing from the spirit of the present application.

Figure 1:
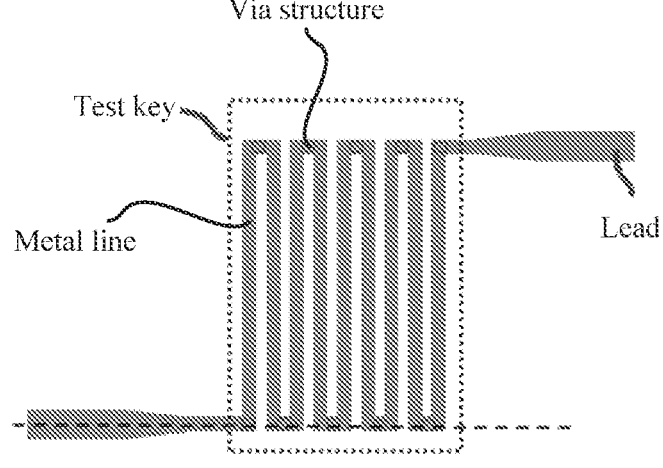
FIG. 1 illustrates a top view of a bottom layer metal interconnection line structure in the present application.
Figure 2:
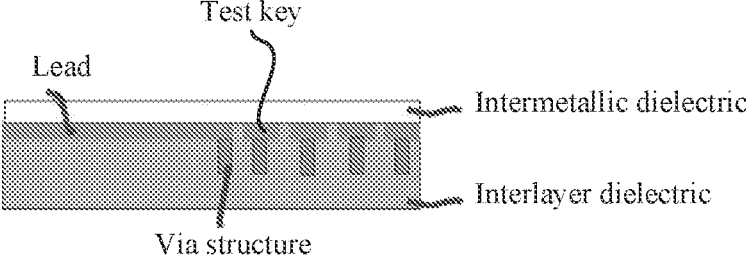
FIG. 2 illustrates a schematic diagram of a sectional structure of the bottom layer metal interconnection line structure in the present application.

Please refer to FIGS. 1-2. It should be noted that the drawings provided in the embodiments are only used to illustrate the basic concept of the present application in a schematic way, so the drawings only show the components related to the present application rather than being drawn according to the number, shape, and size of the components in actual implementations. The type, number, and proportion of various components can be changed randomly in the actual implementations, and the layout of the components may be more complicated.

The present application provides a bottom layer metal interconnection line structure, at least including:

a test key and leads connected to the test key; the test key being composed of a plurality of metal lines connected end-to-end; the plurality of metal lines being arranged in the same plane in a winding manner, wherein at least one suspending via structure is provided at each winding point.

Two leads are provided and respectively connected to ends of the metal lines located at a head end and a tail end in the test key.

Referring to FIG. 1, FIG. 1 illustrates a top view of the bottom layer metal interconnection line structure in the present application. The bottom layer metal interconnection line structure at least includes: a test key and leads connected to the test key; the test key being composed of a plurality of metal lines connected end-to-end; the plurality of metal lines being arranged in the same plane in a winding manner, wherein at least one suspending via structure is provided at each winding point. Two leads are provided and respectively connected to ends of the metal lines located at a head end and a tail end in the test key.

In this embodiment of the present application, the plurality of metal lines have a same length; and the plurality of metal lines have a same width. As such, the test key is formed into a serpentine structure as shown in FIG. 1. In this embodiment of the present application, referring to FIG. 1, each of the leads and each of the metal lines are placed perpendicular to each other in the same plane. In FIG. 1, the metal lines are placed longitudinally, the leads are placed transversely, and the metal line and the lead are perpendicular to each other.

In this embodiment of the present application, at least one downward suspending via structure is provided at each winding point. Referring to FIG. 1, the winding point is a connection end between adjacent metal lines, and the downward suspending refers to a direction of the via structure being distributed below and perpendicular to a plane where the top view shown in FIG. 1 is located.

In other embodiments, an upward suspending via structure and at least one downward suspending via structure are provided at each winding point. The upward suspending refers to a direction of the via structure being distributed above and perpendicular to the plane where the top view shown in FIG. 1 is located.

In this embodiment of the present application, the via structure is filled with tungsten. In this embodiment of the present application, each metal line has a length of 18 μm and a width of 45 nm.

In this embodiment of the present application, a cross section of the downward suspending via structure is rectangular, with a length and a width being 45 nm respectively, and a longitudinal depth of the downward suspending via structure is 80 nm.

In this embodiment of the present application, an interlayer dielectric fully fills between the downward suspending via structures. In this embodiment of the present application, the test key and the leads are covered with an intermetallic dielectric. Referring to FIG. 2, FIG. 2 illustrates a schematic diagram of a sectional structure of the bottom layer metal interconnection line structure in the present application. In this embodiment of the present application, an interlayer dielectric fully fills between the downward suspending via structures, and the test key and the leads are covered with an intermetallic dielectric.

In this embodiment of the present application, a maximum root-mean-square current value of the metal interconnection line structure is 1.30 mA. Under an environmental stress of 110° C., a maximum root-mean-square current (Irms) that can be withstood under a temperature rise of 5° C. is measured. An Irms value of a metal interconnection line structure provided with no via structure in the prior art is 0.92 mA, while an Irms value of the bottom layer metal interconnection line structure of the present application is 1.30 mA, indicating that the withstand current is increased by about 41%.

In this embodiment of the present application, the other end of the downward suspending via structure is connected to a gate of a device, and a longitudinal depth of the downward suspending via structure does not exceed a half of a depth of the gate of the device.

In this embodiment of the present application, the intermetallic dielectric is covered with an upper layer metal, and a depth of the downward suspending via structure does not exceed a half of a depth of the upper layer metal.

To sum up, the present application increases the maximum root-mean-square current that the winding metal interconnection lines can withstand while improving a heat dissipation problem of the bottom layer metal interconnection lines. Therefore, the present application effectively overcomes various defects in the prior art and has high industrial utilization value.

The above embodiments merely illustrate the principle and effect of the present application, rather than limiting the present application. Anyone skilled in the art can modify or change the above embodiments without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A bottom layer metal interconnection line structure, at least comprising:
   a test key and leads connected to the test key, the test key being composed of a plurality of metal lines connected end-to-end, the plurality of metal lines being arranged in a same plane in a winding manner, wherein at least one suspending via structure is provided at each winding point,
   wherein the leads comprise two leads respectively connected to ends of the metal lines located at a head end and a tail end in the test key,
   wherein the metal lines are placed longitudinally, the leads are placed transversely,
   the winding point comprises a connection end between adjacent metal lines of the test key, and
   the test key is configured for bottom layer metal interconnect and heat dissipation.

2. The bottom layer metal interconnection line structure according to claim 1, wherein the plurality of metal lines have a same length; and the plurality of metal lines have a same width.

3. The bottom layer metal interconnection line structure according to claim 1, wherein the at least one suspending via structure comprises a downward suspending via structure, wherein the downward suspending via structure is distributed below and perpendicular to the plane.

4. The bottom layer metal interconnection line structure according to claim 3, wherein an interlayer dielectric fully fills between downward suspending via structures.

5. The bottom layer metal interconnection line structure according to claim 4, wherein the test key and the leads are covered with an intermetallic dielectric.

6. The bottom layer metal interconnection line structure according to claim 5, wherein the intermetallic dielectric is covered with an upper layer metal, and a depth of the downward suspending via structure does not exceed a half of a depth of the upper layer metal.

* * * * *